United States Patent
Chen et al.

(10) Patent No.: US 11,163,003 B2
(45) Date of Patent: Nov. 2, 2021

(54) ELECTRONIC DEVICE TEST DATABASE GENERATING METHOD AND ELECTRONIC DEVICE TEST DATABASE GENERATING APPARATUS

(71) Applicant: Realtek Semiconductor Corp., HsinChu (TW)

(72) Inventors: Po-Lin Chen, Chiayi County (TW); Ying-Yen Chen, Hsinchu (TW); Chia-Tso Chao, Hsinchu (TW); Tse-Wei Wu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 42 days.

(21) Appl. No.: 16/203,576

(22) Filed: Nov. 28, 2018

(65) Prior Publication Data
US 2019/0346508 A1    Nov. 14, 2019

(30) Foreign Application Priority Data
May 10, 2018    (TW) .................................. 107115945

(51) Int. Cl.
G06F 30/33 (2020.01)
G06F 30/398 (2020.01)
G01R 31/3183 (2006.01)
G01R 31/3185 (2006.01)

(52) U.S. Cl.
CPC ............... *G01R 31/318357* (2013.01); *G01R 31/31835* (2013.01); *G01R 31/318533* (2013.01); *G06F 30/33* (2020.01); *G06F 30/398* (2020.01)

(58) Field of Classification Search
USPC ......................................................... 716/112
See application file for complete search history.

(56) References Cited

U.S. PATENT DOCUMENTS

| 6,077,307 | A  | * | 6/2000 | Benzel ................. | G06F 30/398 |
|           |    |   |        |                        | 716/52 |
| 2007/0192754 | A1 | * | 8/2007 | Hofsaess ............... | G06F 30/398 |
|           |    |   |        |                        | 716/52 |
| 2012/0079439 | A1 | * | 3/2012 | Akar ..................... | G06F 30/398 |
|           |    |   |        |                        | 716/106 |
| 2018/0018419 | A1 | * | 1/2018 | Rowhani ............. | H01L 27/0207 |

FOREIGN PATENT DOCUMENTS

| CN | 105745623 A | 7/2016 |
| TW | 201732690 A | 9/2017 |

* cited by examiner

*Primary Examiner* — Bryce M Aisaka
(74) *Attorney, Agent, or Firm* — Winston Hsu

(57) ABSTRACT

An electronic device test database generating method, comprising: (a) acquiring cell layout information of a target electronic device; (b) generating possible defect location information of the target electronic device according to the cell layout information, wherein the possible defect location information comprises at least one possible defect location of the target electronic device; (c) testing the target electronic device according to the possible defect location information to generate a testing result; and (d) generating an electronic device test database according to the testing result.

17 Claims, 8 Drawing Sheets

ELECTRONIC DEVICE TEST DATABASE GENERATING METHOD AND ELECTRONIC DEVICE TEST DATABASE GENERATING APPARATUS

BACKGROUND OF THE INVENTION

1. Field of the Invention

The present invention is related to an electronic device test database generating method and an electronic device test database generating apparatus.

2. Description of the Prior Art

It is suggested in a conventional integrated circuit (IC) testing method to transmit testing signals into possible defect locations within an IC, and determine what kind of defects occur according to output signals generated by the possible defect locations.

However, the way to determine the possible defect locations is too rough in current IC testing method. For example, when a distance between two metal lines is far from each other, location between the two metal lines may comprise other IC components, and thereby at least one equivalent capacitor or at least one equivalent resistor may be formed, thus, even if the location between the two metal lines have no defect, it may be regarded as a possible defect location.

Thus, the conventional IC testing method may perform many unnecessary tests, and thereby prolong testing time.

SUMMARY OF THE INVENTION

Thus, an objective of the present invention is to provide an electronic device test database generating method to prevent unnecessary tests.

An embodiment of the present invention provides an electronic device test database generating method, comprising: (a) acquiring cell layout information of a target electronic device; (b) generating possible defect location information of the target electronic device according to the cell layout information, wherein the possible defect location information comprises at least one possible defect location of the target electronic device; (c) testing the target electronic device according to the possible defect location information to generate a testing result; and (d) generating an electronic device test database according to the testing result.

An embodiment of the present invention provides an electronic device test database generating apparatus, comprising a calculating device, arranged to acquire cell layout information of a target electronic device, and generate possible defect location information of the target electronic device according to the cell layout information, wherein the possible defect location information comprises at least one possible defect location of the target electronic device; and a testing device, arranged to test the target electronic device according to the possible defect location information to generate a testing result, wherein the calculating device generates an electronic device test database according to the testing result.

According to the aforementioned embodiment, the method may prevent performing test on unnecessary locations, which may reduce time for electronic device test.

These and other objectives of the present invention will no doubt become obvious to those of ordinary skill in the art after reading the following detailed description of the preferred embodiment that is illustrated in the various figures and drawings.

DETAILED DESCRIPTION

Contents of the present invention will be described in different embodiments, however, please note that the following embodiments are for illustrative purpose only, and are not meant to be a limitation of the present invention. For example, sizes, locations, shapes, numbers of components in the following embodiments are not limited to examples in figures. Additionally, the method mentioned in embodiments may be executed through hardware (e.g. circuit or apparatus), or be executed through combining hardware and software (e.g. a processor installed with software). Moreover, although the following electronic device is described by taking IC as an example, it may be applied to any of other types of electronic devices.

Figure 1:
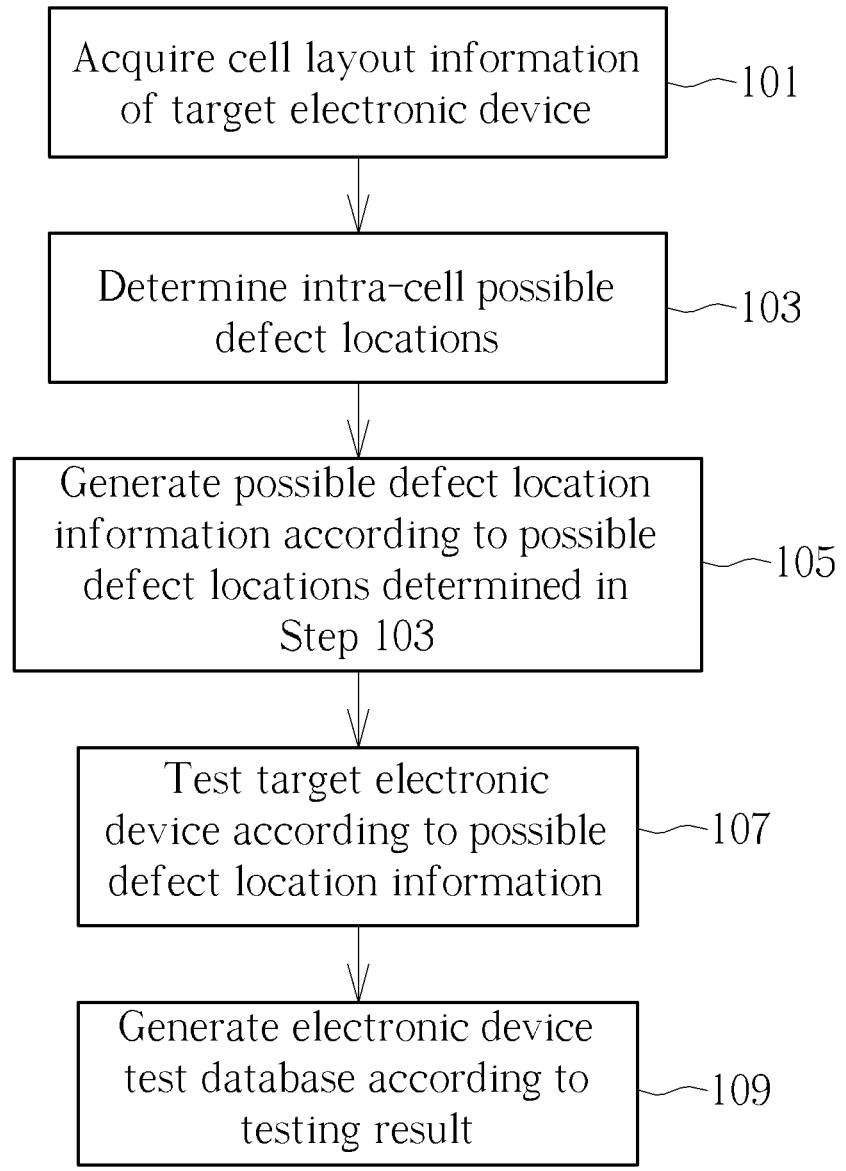
FIG. 1 illustrates a flowchart of an electronic device test database generating method according to an embodiment of the present invention.

FIG. 1 illustrates a flowchart of an electronic device test database generating method (which may be referred to as the method, for brevity) according to an embodiment of the present invention, comprising the following steps:

Step 101:

Acquire cell layout information of a target electronic device. In an embodiment, for example, the target electronic device comprises at least one cell, but the target electronic device may comprise no cell in other examples. In an embodiment, a cell within the at least one cell comprises circuit having operational function (such as a logic gate), and locations inside the cell or outside the cell may comprise components for transmitting signals (e.g. metal lines or welding pads). The locations inside the cell or outside the cell may also comprise passive components (e.g. capacitors or resistors). For example, the components inside the cell or outside the cell may be arbitrarily set according to different requirements. And in an embodiment, cell layout information comprises layout information inside the cell and the layout information within a predetermined range of respective cells.

Step 103:

Determine intra-cell possible defect locations. In an embodiment, the cell layout information comprises component location information or component shape information of respective components within the target electronic device, and the possible defect locations may be determined in Step 103 according to the component location information or the component shape information.

Detail content of this portion will be described later.

Step 105:

Generate possible defect location information according to the possible defect locations determined in Step 103. In an embodiment, the possible defect location information is a possible defect location list, and all of the possible defect locations within the target electronic device are listed on the list.

Step 107:

Test the target electronic device according to the possible defect location information, for example, transmit testing signals to the possible defect locations listed on the possible defect location list, and generate a testing result according to output signals of these possible defect locations. Please note that, examples of the test mentioned here may comprise: practically transmitting the testing signals to the target electronic device, and utilizing simulation software (e.g. SPICE) on circuit design of the target electronic device to perform simulation for test. Other testing method or simulation method that may achieve the testing purpose should also be covered in the present invention.

Step 109:

Generate an electronic device test database according to the testing result. In an embodiment, the electronic device test database comprises the possible defect location information, and relation between the testing signals, the output signals, and types of defects. For example, for a possible defect location P, when the testing signal is A and the output signal is A1, it means a defect X exists. For a possible defect location Q, when the testing signal is B and the output signal is B1, it means a defect Y exists. In an embodiment, Step 107 may find that the possible defect locations have defects, but the types of the defects may be confirmed through referring to other information, for example, through utilizing other apparatus or simulation software to confirm whether defects such as short circuit, leakage, etc. exist.

After the electronic device test database is generated, an electronic device test method or an electronic device test system can apply the electronic device test to test an electronic device.

Figure 2:
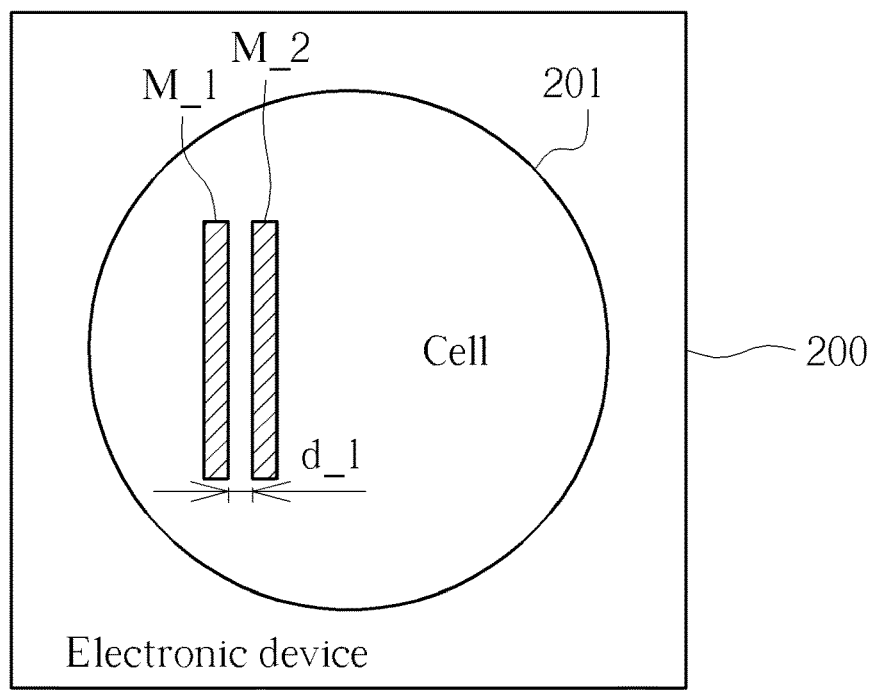
FIG. 2 and FIG. 3 illustrate diagrams of different examples of intra-cell possible defect locations within the electronic device.

In the following, Step 103 is described in detail by examples. In an embodiment, when it is known according to the component location information that a distance between a first metal component and a second metal component is less than a distance threshold, a location between the first metal component and the second metal component may be determined as a possible defect location in Step 103. Taking FIG. 2 as an example, an electronic device 200 comprises a cell 201, and the cell 201 comprises metal lines M_1 and M2 therein, when a distance d_1 between the metal lines M_1 and M_2 is less than a distance threshold, a location between the metal lines M_1 and M_2 may be determined as the possible defect location in Step 103. The method may avoid the problem that a location between two components far from each other is determined as the possible defect location in the prior art.

In an embodiment, when the number of other components (e.g. other metal lines, capacitors or resistors) between the metal lines M_1 and M_2 is less than a number threshold (the number threshold is 1 in this example), the location between the metal lines M_1 and M_2 may be determined as the possible defect location in Step 103. Advantage of this step in this embodiment is described below. When there are too many other components between the metal lines M_1 and M_2, these other components may introduce many side effects (such as capacitance effect). In this situation, when the testing signal is inputted into this location, these other components may generate variations on the output signal. Although these variations are within a reasonable range, this location may be determined as defective. Thus, locations having too many components may be excluded from the possible defect location list in this step, which may omit unnecessary testing steps.

Figure 3:
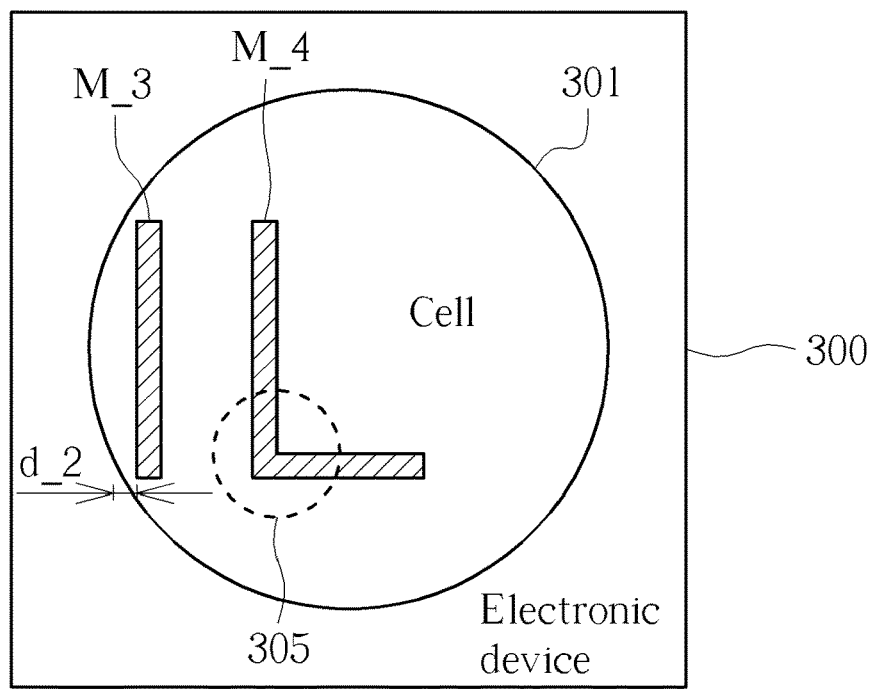

In an embodiment, when a distance between a metal component and a boundary of a cell is less than a distance threshold, Step 103 may determine a location between the metal component and the boundary as the possible defect location. Take FIG. 3 as an example, an electronic device 300 comprises a cell 301 therein, and the cell 301 comprises a boundary 303 and further comprises a metal line M_3. Since a distance d_2 between the metal line M_3 and the boundary 303 is less than a distance threshold, a location between the metal line M_3 and the boundary 303 may be determined as the possible defect location in Step 103.

In an embodiment, when the number of other components (e.g. other metal lines, capacitors or resistors) between the metal line M_3 and the boundary 303 is less than a number threshold (the number threshold is 1 in this example), the location between the metal line M_3 and the boundary 303 may be determined as the possible defect location in Step 103.

In an embodiment, the cell layout information comprises the component shape information of respective components within the target electronic device, and the possible defect location information may be generated in Step 103 according to the component shape information. For example, the metal line M_4 in FIG. 3 comprises a bending part 305, which may be determined as the possible defect location in Step 103.

Figure 4:
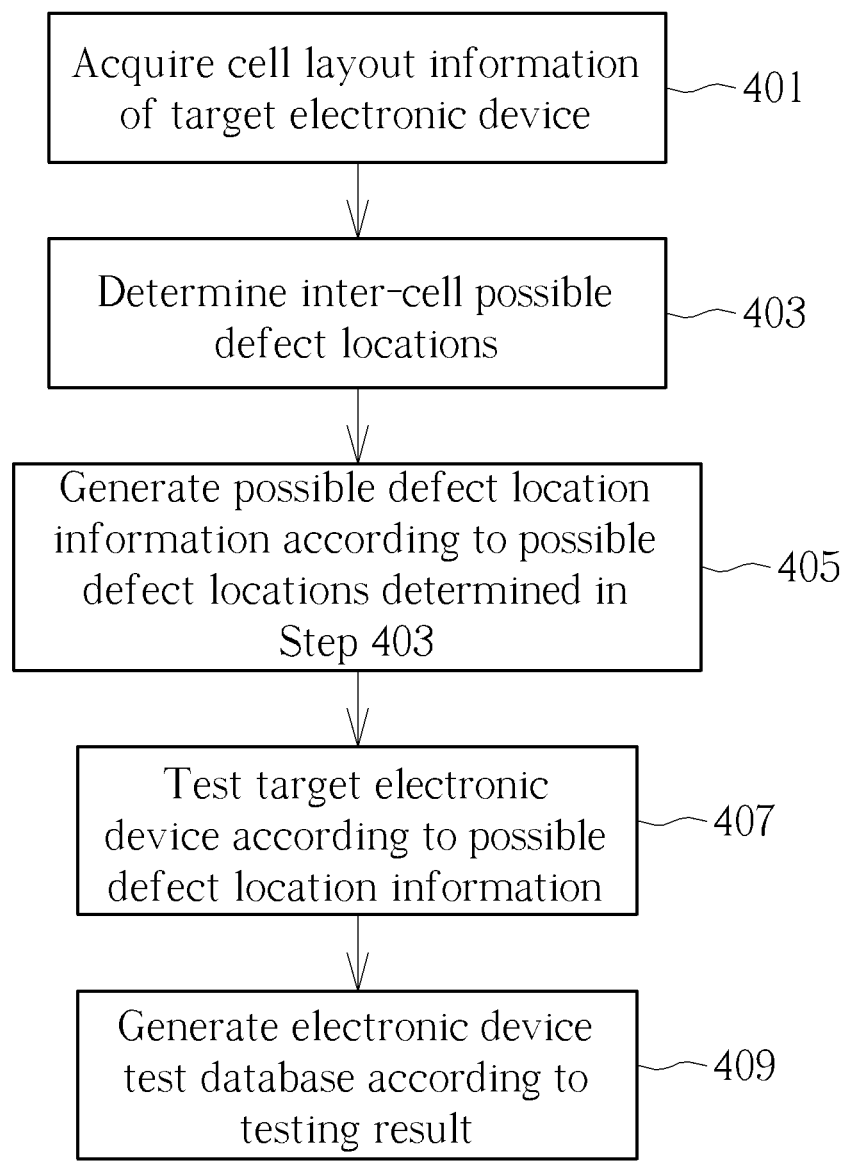
FIG. 4 illustrates a flowchart of the electronic device test database generating method according to another embodiment of the present invention.

FIG. 4 illustrates a flowchart of the method according to another embodiment of the present invention, comprising:

Step 401:

Acquire the cell layout information of a target electronic device. The target electronic device comprises at least one cell.

Step 403:

Determine inter-cell possible defect locations. In an embodiment, the cell layout information comprises cell location information of respective cells within the target electronic device, and the possible defect locations may be determined in Step 403 according to the cell location information.

Detail content of this portion will be described later.

Step 405:

Generate the possible defect location information according to the possible defect locations determined in Step 403. In an embodiment, the possible defect location information is a possible defect location list, and all of the possible defect locations within the target electronic device are listed on the possible defect location list.

Step 407:

Test the target electronic device according to the possible defect location information, for example, transmit the testing signals to the possible defect locations listed on the possible defect location list, and generate the testing result according to the output signals of these possible defect locations.

Step 409:

Generate the electronic device test database according to the testing result.

Figure 5:
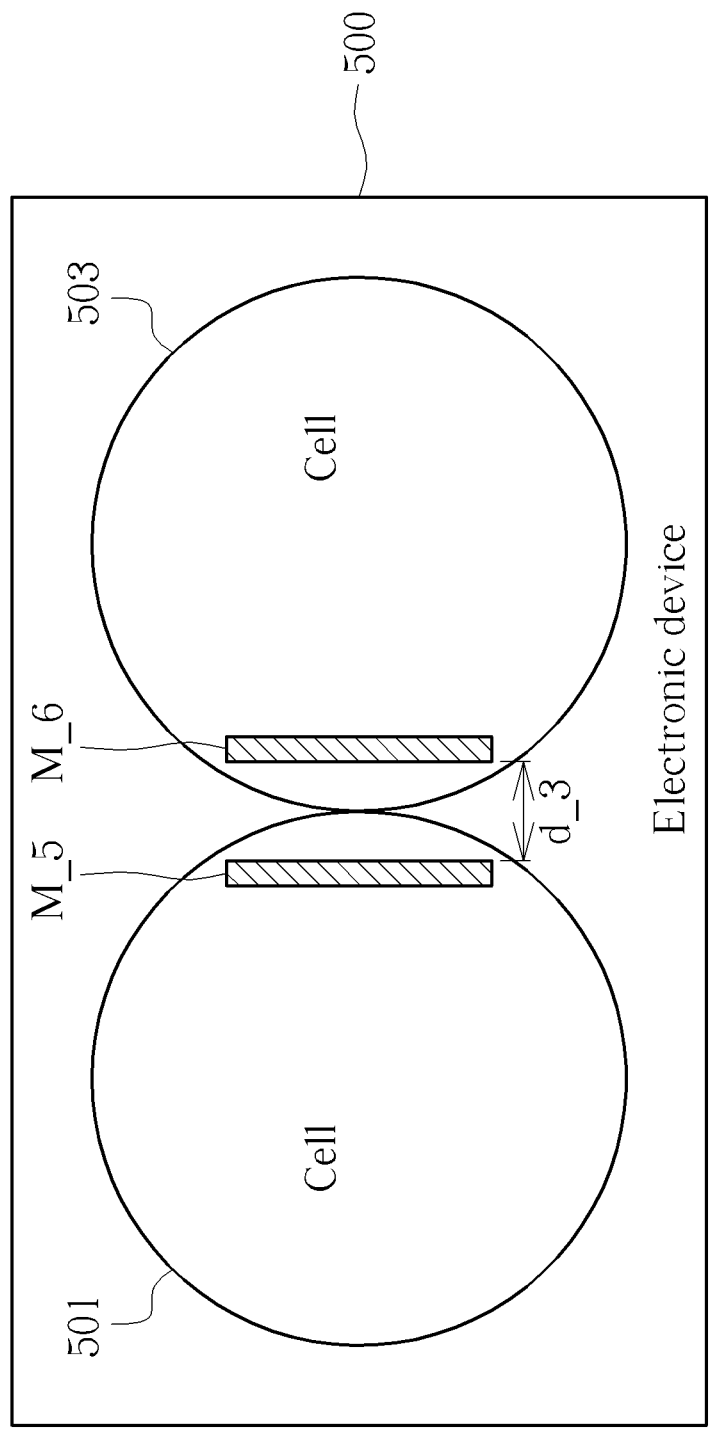
FIG. 5 illustrates a diagram of an example of inter-cell possible defect locations within the electronic device.

In the following, Step 403 is described in detail by examples. In an embodiment, when the component location information indicates that a distance between a first metal component and a second metal component is less than a distance threshold, a location between the first metal component and the second metal component may be determined as the possible defect location in Step 403. Taking FIG. 5 as an example, an electronic device 500 comprises cells 501 and 503, and the cells 501 and 503 comprise metal lines M_5 and M_6, respectively, and when a distance d 3 between the metal lines M_5 and M_6 is less than a distance threshold, a location between the metal lines M_5 and M_6 may be determined as the possible defect location in Step 403.

In an embodiment, when the number of other component (e.g. other metal lines, capacitors or resistors) between the metal lines M_5 and M_6 is less than a number threshold (the number threshold is 1 in this example), the location between the metal lines M_5 and M_6 may be determined as the possible defect location in Step 403.

In an embodiment, in addition to finding intra-cell or inter-cell possible defect locations, outside-cell possible defect locations may also be found according to the cell layout information. For example, the outside-cell possible defect locations may be found according to the component location information and the component shape information within the cell layout information. That is, the aforementioned embodiments may be applied to the embodiment of the outside-cell possible defect locations.

Figure 6:
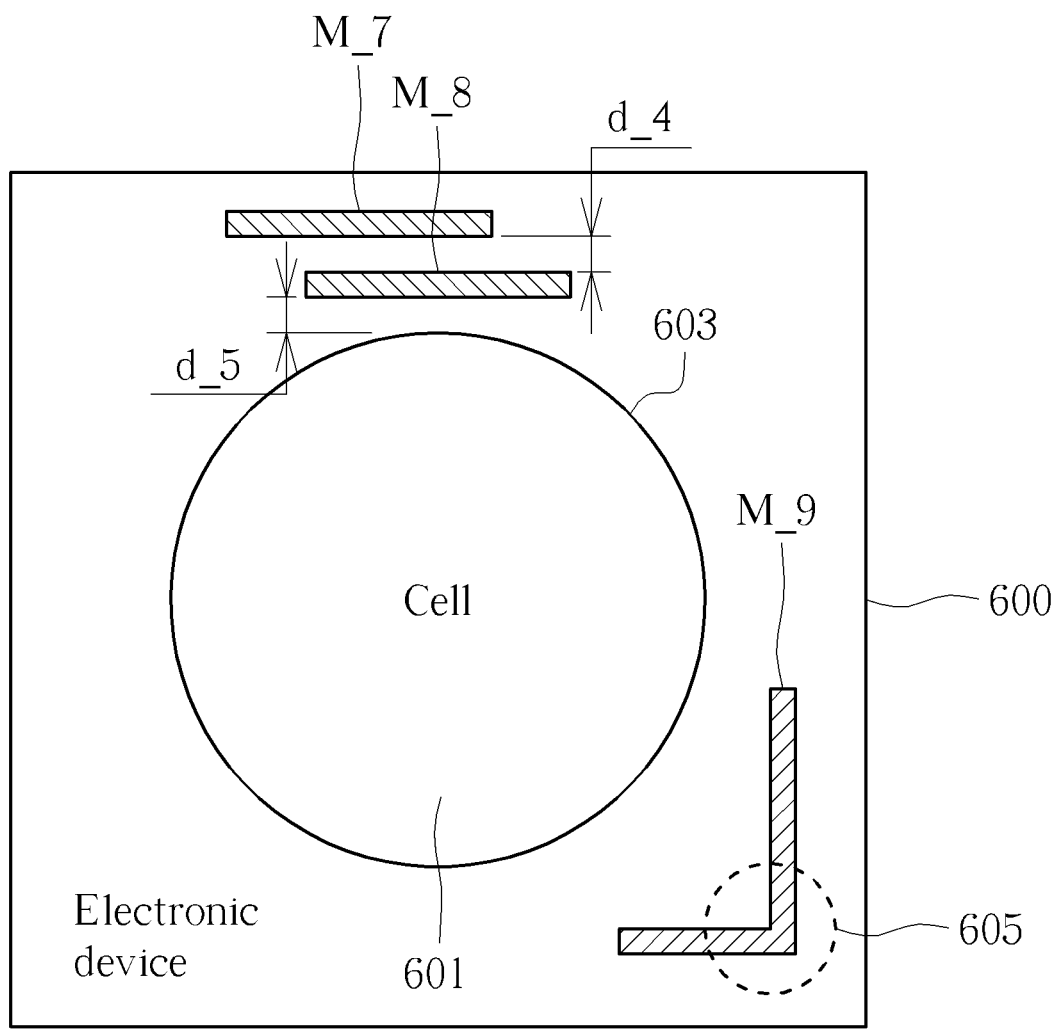
FIG. 6 illustrates a diagram of an example of outside-cell possible defect locations within the electronic device.

Taking FIG. 6 as an example, an electronic device 600 comprises a cell 601, and further comprises metal lines M_7 and M_8 outside the cell 601, and when a distance d_4 between the metal lines M_7 and M_8 is less than a distance threshold, a location between the metal lines M_7 and M_8 may be determined as the possible defect location. In an embodiment, when the number of other components (e.g. other metal lines, capacitors or resistors) between the metal lines M_7 and M_8 is less than a number threshold (the number threshold is 1 in this example), the location between the metal lines M_7 and M_8 may be determined as the possible defect location. In an embodiment, since a distance d_5 between the metal line M_8 and a boundary 603 is less than a distance threshold, a location between the metal line M_8 and the boundary 603 may be determined as the possible defect location. In an embodiment, when the number of other components (e.g. other metal lines, capacitors or resistors) between the metal lines M_8 and the boundary 603 is less than a number threshold (the number threshold is 1 in this example), the location between the metal lines M_8 and the boundary 603 may be determined as the possible defect location. Additionally, a metal line M_9 comprises a bending part 605, which may be determined as the possible defect location.

Figure 7:
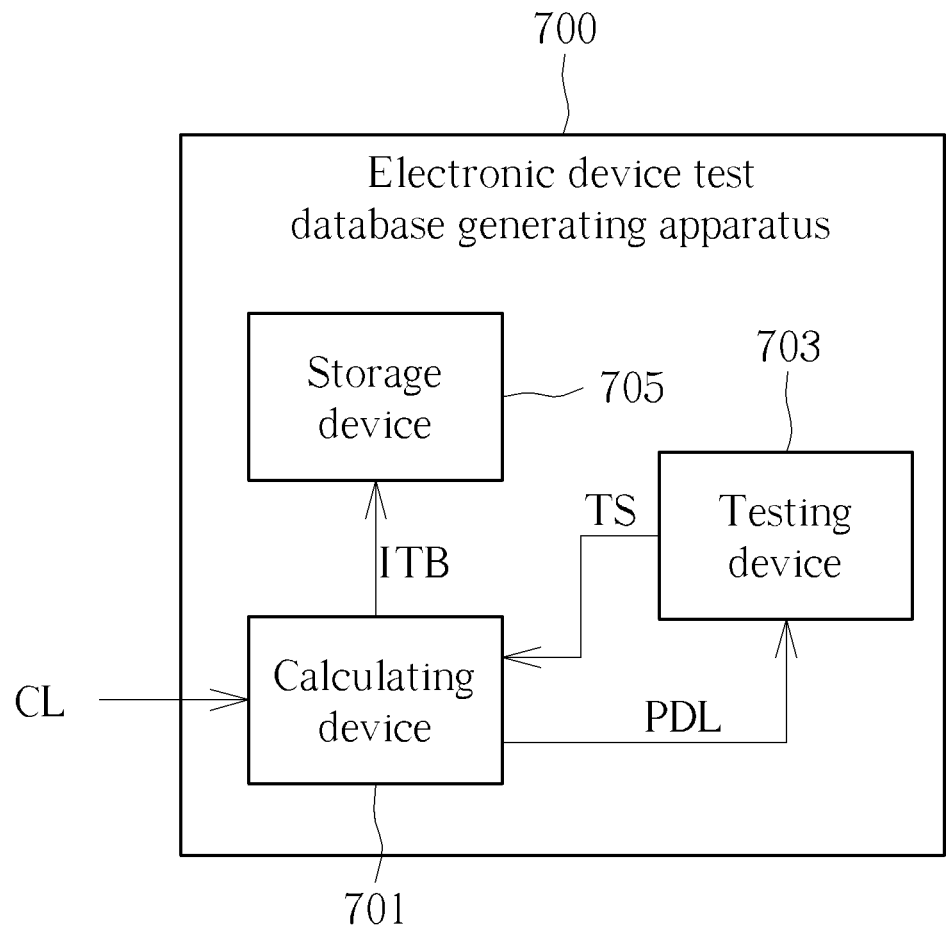
FIG. 7 illustrates a block diagram of an electronic device test database generating apparatus according to embodiments of the present invention.

FIG. 7 illustrates a block diagram of an electronic device test database generating apparatus according to an embodiment of the present invention. Please note that, components shown in FIG. 7 may be implemented by hardware (e.g. circuit or apparatus) or implemented by combining hardware and software (e.g. a processor installed with software). Additionally, the components shown in FIG. 7 may be integrated or further divided into more components. For example, a calculating device 701 and a testing device 703 may be integrated into a single device or be further divided into more devices.

Please refer to FIG. 7, where the electronic device test database generating apparatus 700 comprises the calculating device 701 and the testing device 703. The calculating device 701 receives cell layout information CL, and calculates possible defect location information PDL for the testing device 703 according to the cell layout information CL. After the testing device 703 performs practical test or simulation test on the target electronic device (not shown), the testing device 703 may have generated a testing result TS for the calculating device 701. The calculating device 701 generates an electronic device test database ITB according to the testing result TS. In an embodiment, the electronic device test database generating apparatus 700 further comprises a storage device 705, and the electronic device test database ITB may be stored in the storage device 705. In some examples, however, the storage device 705 may be located outside the electronic device test database generating apparatus 700. The storage device 705 may be any of various non-transient storage devices, for example, hard drives, compact discs, memories, etc. The electronic device test database ITB may be utilized to test an electronic device by another device, such as an electronic device testing device. For example, the electronic device testing device may test the possible defect locations according to the possible defect location information recorded in the electronic device test database ITB, and determine what types of defects exist according to the electronic device test database ITB and the output signals of the possible defect locations.

Figure 8:
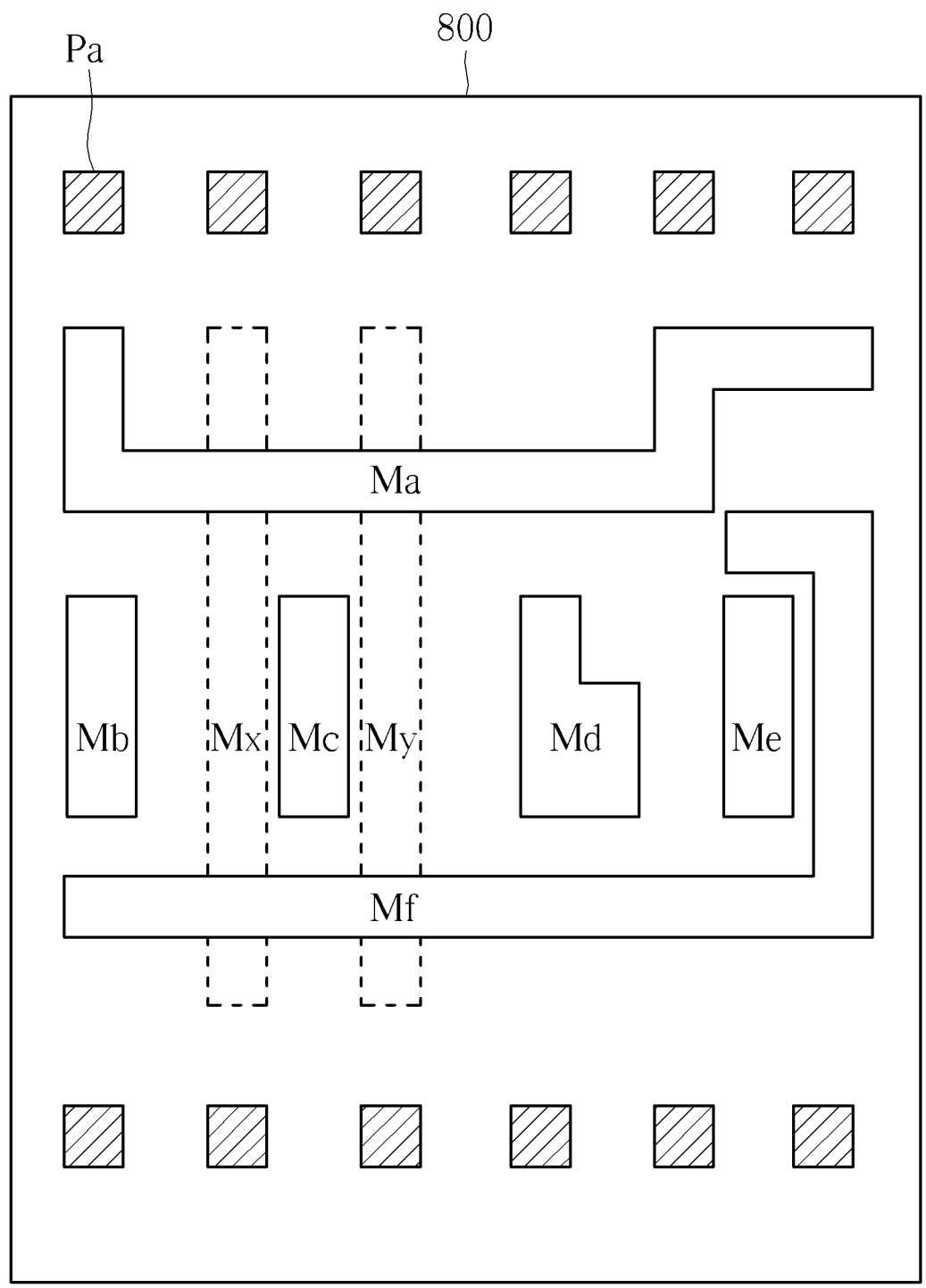
FIG. 8 and FIG. 9 illustrate examples of the electronic device test database generating method and the electronic device test database generating apparatus of the present invention being utilized on practical cell layout.
Figure 9:
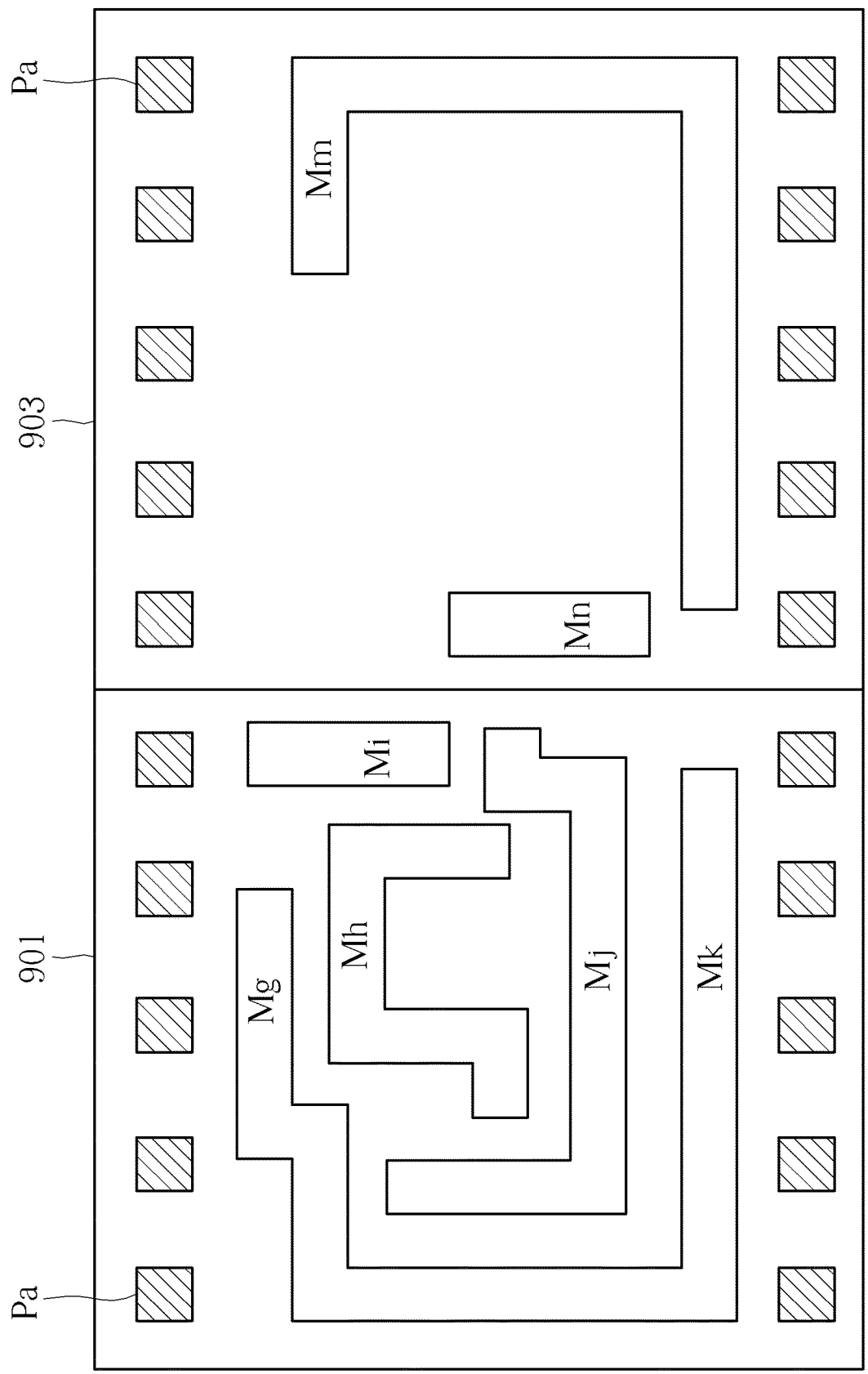

FIG. 8 and FIG. 9 illustrate examples of the electronic device test database generating method and the electronic device test database generating apparatus of the present invention being utilized on practical cell layout. FIG. 8 illustrates an example of a single cell, and FIG. 9 illustrates an example of two cells. Please note that, in the following, only partial components in FIG. 8 and FIG. 9 are taken as examples for further descriptions.

As shown in FIG. 8, a cell 800 comprises a pad Pa (only one of multiple pads is labeled), and metal lines Ma-Mf (such as the metal lines {Ma, Mb, Mc, Md, Me, Mf}) and Mx-My (such as the metal lines Mx and My) therein. The metal lines Ma-Mf are located in a same layer, and the metal lines Mx-My and the metal lines Ma-Mf are located in different layers. Taking the metal line Ma as an example, according to the embodiments described above, locations between the metal line Ma and the metal lines Mb-Md may be determined as the possible defect locations, however, since the metal line Mf exists between the metal line Ma and the metal line Me, a location between the metal line Ma and the metal line Me may not be determined as the possible defect location.

In the example of FIG. 9, a cell 901 comprises the pad Pa (only one of multiple pads is labeled) and metal lines Mg-Mk (such as the metal lines {Mg, Mh, Mi, Mj, Mk}), and a cell 903 comprises the pad Pa (only one of multiple pads is labeled) and metal lines Mn-Mm (such as the metal lines Mn and Mm). Taking the metal line Mn as an example, according to the embodiments described above, a location between the metal line Mn and the metal line Mj may be determined as the possible defect location, however, since there is the metal line Mi between the metal line Mn and Mh, a location between the metal line Mn and Mh will not be determined as the possible defect location. Additionally, the metal line Mk and the metal line Mm are close enough to be determined as the possible defect location, and the upper half and the lower half of the metal line Mm are too far to be determined as the possible defect location.

According to the aforementioned embodiments, testing on unnecessary location can be avoided to reduce time for electronic devices test.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device test database generating method, comprising:
   (a) acquiring cell layout information of a target electronic device;
   (b) generating possible defect location information of the target electronic device according to the cell layout information, wherein the possible defect location information comprises at least one possible defect location of the target electronic device;
   (c) transmitting a testing signal to the possible defect location within the target electronic device, and generating a testing result according to an output signal of the possible defect location; and
   (d) generating an electronic device test database according to the testing result;
   wherein the cell layout information comprises component location information of respective components within the target electronic device, and the step (b) generates the possible defect location information according to the component location information;
   wherein the target electronic device comprises at least one metal component, wherein when a number of other components between a first metal component and a second metal component is less than a number threshold, the step (b) determines a location between the first metal component and the second metal component as a possible defect location within the at least one possible defect location.

2. The electronic device test database generating method of claim 1, wherein when a distance between the first metal component and the second metal component is less than a distance threshold, the step (b) determines a location between the first metal component and the second metal component as a possible defect location within the at least one possible defect location.

3. The electronic device test database generating method of claim 1, wherein the target electronic device further comprises at least one cell, wherein when a distance between the metal component and a boundary of the cell is less than a distance threshold, the step (b) determines a location between the metal component and the boundary as a possible defect location within the at least one possible defect location.

4. The electronic device test database generating method of claim 1, wherein the target electronic device further comprises at least one cell, wherein when a number of other components between the metal component and a boundary of the cell is less than a number threshold, the step (b) determines a location between the metal component and the boundary as a possible defect location within the at least one possible defect location.

5. The electronic device test database generating method of claim 1, wherein the cell layout information comprises component shape information of respective components within the target electronic device, and the step (b) generates the possible defect location information according to the component shape information.

6. The electronic device test database generating method of claim 5, wherein when any of the at least one metal component has a bending part, the step (b) determines the bending part as a possible defect location within the at least one possible defect location.

7. The electronic device test database generating method of claim 1, wherein the target electronic device comprises at least one cell, and the possible defect location information comprises intra-cell possible defect location information.

8. The electronic device test database generating method of claim 1, wherein the target electronic device comprises multiple cells, and the possible defect location information comprises inter-cell possible defect location information.

9. An electronic device test database generating apparatus, comprising:
   a calculating device, arranged to acquire cell layout information of a target electronic device, and generate possible defect location information of the target electronic device according to the cell layout information, wherein the possible defect location information comprises at least one possible defect location of the target electronic device; and
   a testing device, arranged to transmit a testing signal to the possible defect location within the target electronic device, and to generate a testing result according to an output signal of the possible defect location, wherein the calculating device generates an electronic device test database according to the testing result;
   wherein the cell layout information comprises component location information of respective components within the target electronic device, and the calculating device generates the possible defect location information according to the component location information;
   wherein the target electronic device comprises at least one metal component, wherein when a number of other components between a first metal component and a second metal component is less than a number threshold, the calculating device determines a location between the first metal component and the second metal component as a possible defect location within the at least one possible defect location.

10. The electronic device test database generating apparatus of claim 9, wherein when a distance between the first metal component and the second metal component is less than a distance threshold, the calculating device determines a location between the first metal component and the second metal component as a possible defect location within the at least one possible defect location.

11. The electronic device test database generating apparatus of claim 9, wherein the target electronic device further comprises at least one cell, wherein when a distance between the metal component and a boundary of the cell is less than a distance threshold, the calculating device determines a location between the metal component and the boundary as a possible defect location within the at least one possible defect location.

12. The electronic device test database generating apparatus of claim 9, wherein the target electronic device further comprises at least one cell, wherein when a number of other components between the metal component and a boundary of the cell is less than a number threshold, the calculating device determines a location between the metal component and the boundary as a possible defect location within the at least one possible defect location.

13. The electronic device test database generating apparatus of claim 9, wherein the cell layout information comprises component shape information of respective components within the target electronic device, and the calculating device generates the possible defect location information according to the component shape information.

14. The electronic device test database generating apparatus of claim 13, wherein when any of the at least one metal component has a bending part, the calculating device determines the bending part as a possible defect location within the at least one possible defect location.

15. The electronic device test database generating apparatus of claim 9, wherein the target electronic device comprises at least one cell, and the possible defect location information comprises intra-cell possible defect location information.

16. The electronic device test database generating apparatus of claim 9, wherein the target electronic device comprises multiple cells, and the possible defect location information comprises inter-cell possible defect location information.

17. An electronic device test database generating method, comprising:
   (a) acquiring cell layout information of a target electronic device;
   (b) generating possible defect location information of the target electronic device according to the cell layout information, wherein the possible defect location information comprises at least one possible defect location of the target electronic device;
   (c) transmitting a testing signal to the possible defect location within the target electronic device, and generating a testing result according to an output signal of the possible defect location; and
   (d) generating an electronic device test database according to the testing result;
   wherein the cell layout information comprises component location information of respective components within the target electronic device, and the step (b) generates the possible defect location information according to the component location information;
   wherein the target electronic device comprises at least one metal component and at least one cell, wherein when a number of other components between the metal component and a boundary of the cell is less than a number threshold, the step (b) determines a location between the metal component and the boundary as a possible defect location within the at least one possible defect location.

* * * * *